US 6,605,954 B1

(12) United States Patent
Nagar

(10) Patent No.: US 6,605,954 B1
(45) Date of Patent: Aug. 12, 2003

(54) REDUCING PROBE CARD SUBSTRATE WARPAGE

(75) Inventor: Mohan R. Nagar, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 71 days.

(21) Appl. No.: 10/055,812

(22) Filed: Jan. 23, 2002

(51) Int. Cl.[7] .................................................. G01R 31/02
(52) U.S. Cl. ....................................... 324/755; 324/754
(58) Field of Search ................................. 324/754, 755, 324/761, 762, 765; 439/66, 70, 71, 90, 91; 29/842, 844, 825, 592, 592.1, 593

(56) References Cited

U.S. PATENT DOCUMENTS 5,475,317 A * 12/1995 Smith .......................... 324/760
5,813,870 A * 9/1998 Gaynes et al. ................. 439/91
6,069,482 A * 5/2000 Hilton ......................... 324/755

* cited by examiner

*Primary Examiner*—Vinh P. Nguyen
(74) *Attorney, Agent, or Firm*—Luedeka, Neely & Graham, PC

(57) ABSTRACT

An electrically non conducting material disposed within one or more of the voids of a probe card between a substrate thereof and a tester interface to reinforce the substrate against flexing, bending, and warpage.

12 Claims, 1 Drawing Sheet

REDUCING PROBE CARD SUBSTRATE WARPAGE

FIELD

This invention relates to the fabrication of integrated circuits. More particularly, this invention relates to integrated circuit testing.

BACKGROUND

In the manufacture of integrated circuits, such as semiconductor devices, the integrated circuits are typically formed on a substrate, such as a silicon wafer. During and after the fabrication process, the integrated circuit is tested to evaluate the electrical characteristics of the integrated circuit. One test method for flip-chip integrated circuits involves the use of probe cards having probes pins configured to align with contact pads of the integrated circuit. Probe cards generally include an electrically non conducting substrate having electrical traces that are in electrical communication with the probe pins, which are disposed one side of the substrate. A plurality of solder balls are typically disposed on the opposite side of the substrate for electrical communication with the tester.

The probe card is brought into contact with the integrated circuit using a probe station, or prober, with the probe pins contacting the electrical connections on the integrated circuit. The prober aligns the probe pins of the probe card with the electrical connections of the integrated circuit and applies force to the probe pins to obtain good electrical contact between the probe pins and the electrical connections of the integrated circuit, which are typically solder bumps. The probe pins are repeatedly pushed against integrated circuits during testing operations. The repeated force applied to the probe card during such testing tends to deform or warp the substrate of the probe card. Over time, this deformation of the planarity of the probe card substrate tends to inhibit the probe pins from making good electrical contact with the integrated circuits being tested.

What is needed, therefore, is a method for fabricating probe cards so that their substrates are more resistant to deformation, as compared to the substrates of conventional probe cards.

SUMMARY

The above and other needs are met a probe card for testing an integrated circuit having electrical contacts. An interface member connects the probe card to a test station. An electrically non conducting substrate is provided with a first side, a second side, and electrically conducting traces. A plurality of electrically conducting probes are disposed adjacent the second side of the substrate. The probes make electrical connections with the traces, and the probes are also for making forceful contact and electrical connection with the electrical contacts of the integrated circuit.

Electrically conducting members are disposed between the first side of the substrate and the interface member. The electrically conducting members make electrical connection between the traces of the substrate and the interface member, and are disposed such that at least one void is formed between the first side of the substrate and the interface member. An electrically non conducting material is disposed within the at least one void, so as to substantially fill the at least one void. The electrically non conducting material reinforces the substrate against deformation during testing of the integrated circuit, when forceful contact is made between the probes and the electrical contacts of the integrated circuit.

Disposing electrically non-conducting material in the voids of the substrate in accordance with the present invention tends to substantially decrease the degree to which the substrate deforms during use. This results in improved testing and reduced costs.

In various preferred embodiments of the invention, the substrate is a glass filed plastic, and the electrically conducting members are solder bumps. The at least one void are then areas between the solder bumps. Preferably the electrically non conducting material within the .void is either an epoxy or a spacer, most preferably made of the same material as the substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
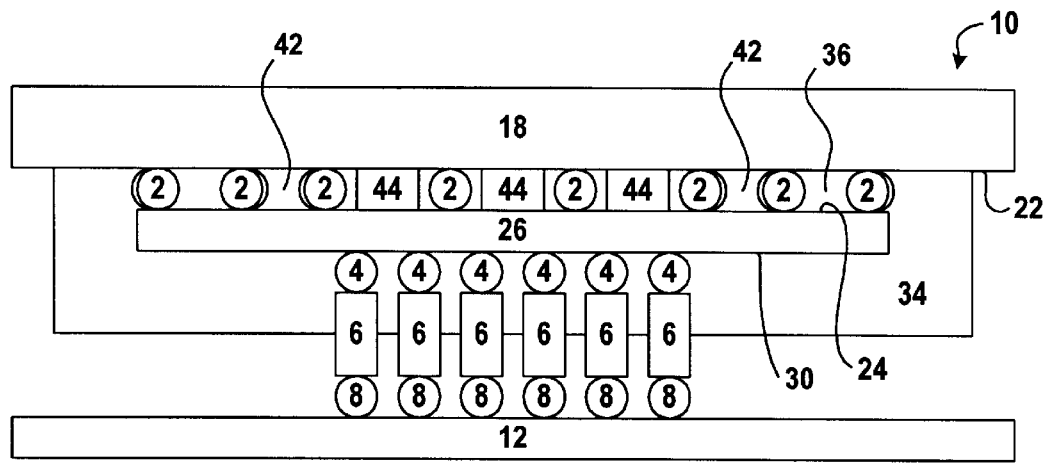
FIG. 1 is a cross sectional view depicting a probe card in accordance with a preferred embodiment of the invention.

The invention enables the fabrication of probe cards for integrated circuit testing having improved construction and function. FIG. 1 depicts a probe card 10 that has been fabricated in accordance with the invention. The probe card 10 is used for testing an integrated circuit 12, such as a flipchip integrated circuit on a silicon chip, with a plurality of electrical contacts, such as solder bumps 8.

The probe card 10 includes a tester interface member 18 for electrically connecting the card 10 to test circuitry. A plurality of solder balls 2 are located between side 22 of the member 18 and side 24 of a substrate 26. The substrate 26 is preferably an electrically non conducting substrate, such as a glass filled plastic, having electrical traces that are in electrical communication with solder bumps 4, disposed adjacent the opposite side 30 of the substrate 26. The solder bumps 4 are electrically connected to a plurality of pin-like probes 6 extending in a direction generally perpendicular to and away from side 30 of the substrate 26. The probes 6 are preferably arranged to line up with the bumps 8 of the integrated circuit 12. The probes 6 are preferably made from an electrically conducting material such as tungsten, beryllium, copper, or alloys of these and other electrically conducting materials such as gold, silver, palladium, platinum, zinc, and the like. An encapsulant 34 preferably provides an exterior seal around the substrate 26.

One or more voids 36 are formed between the substrate 26 and the side 22 of the interface member, in locations that are not occupied by the solder bumps 2. The voids 36 of the probe card 10 are preferably substantially filled with an electrically non-conducting fill material 42. The fill material 42 is preferably an epoxy that is applied during fabrication of the probe card 10, so as to substantially fill all areas between the substrate 26 and the member 18 that are not occupied by a solid member, such as one of the solder bumps 2. In the alternative, a spacer 44 may be positioned in the voids 36. The spacer 44 is preferably an electrically non conducting or insulating solid material configured to fit within one of the voids 36. Preferably, each spacer 44 is made of the same material as the substrate 26.

In yet another embodiment, a combination of filler material 42 and one or more spacers 44 are used to fill the voids. In one embodiment, only the voids 36 that oppose the probes 6 are filled with the filler material 42 or the spacers 44. However, in alternate embodiments all of the voids 36 are filled with either the filler material 42 or the spacers 44. In yet a further embodiment, the voids 36 that oppose the probes 6 are only filled with the filler material 42 or the spacer 44 to that extent which is necessary to inhibit the deformation of the probe card 10 under normal use.

Figure 2:
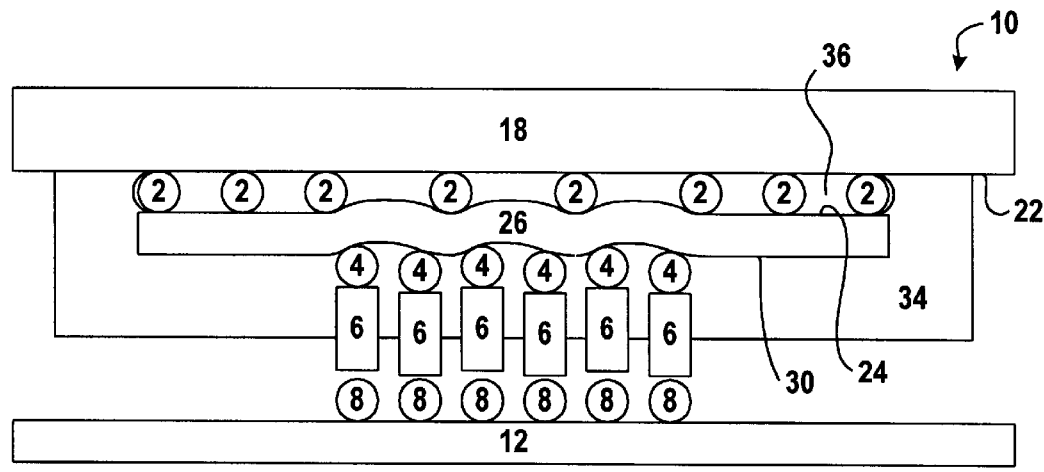
FIG. 2 is a partial cross sectional view of a prior art probe card, showing deformation of the probe card substrate.

During testing of the integrated circuit 12, the probes 6 are aligned with the bumps 8 and an external force is applied to urge the probes 6 against the bumps 8 to obtain good electrical contact between the probes 6 and the bumps 8. The probes 6 are preferably repeatedly urged against the bumps 8 repeatedly during testing. As represented in FIG. 2, in the absence of the spacer 44 or the filler material 42, the repeated force applied to substrate 26 by forcing the probes 6 against the bumps 8 during testing tends to deform the substrate 26. This disruption of the planarity of the substrate 26 would result in many of the probes 6 failing to make good electrical contact with the bumps 8.

Substantially occupying the voids 36 between the tester interface 18 and the substrate 26 with an electrically non-conducting material in accordance with the invention tends to substantially decrease the incidence of deformation of the substrate 26.

It is appreciated that the materials described above, while providing an especially preferred application of the invention, are by way of example only, and that other materials are compatible with the materials, structures, and processes of integrated circuit processing are also generally applicable to the invention as disclosed herein.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A probe card for testing an integrated circuit having electrical contacts, the apparatus comprising:
   a. an interface member for connecting the probe card to a test station,
   b. an electrically non conducting substrate having a first side and an opposing second side, and electrically conducting traces,
   c. a plurality of electrically conducting probes disposed adjacent the second side of the substrate, the probes making electrical connections with the traces, the probes for making forceful contact and electrical connection with the electrical contacts of the integrated circuit,
   d. electrically conducting members disposed between the first side of the substrate and the interface member, the electrically conducting members making electrical connection between the traces of the substrate and the interface member, the electrically conducting members disposed such that at least one void is formed between the first side of the substrate and the interface member, where at least a portion of the at least one void is disposed substantially opposite the probes, and
   e. an electrically non conducting material disposed within the at least one void so as to substantially fill the at least one void and to reinforce the substrate against deformation during testing of the integrated circuit when forceful contact is made between the probes and the electrical contacts of the integrated circuit.

2. The probe card of claim 1, wherein the substrate comprises a glass filed plastic.

3. The probe card of claim 1, wherein the electrically conducting members comprise solder bumps and the at least one void comprises areas between the solder bumps.

4. The probe card of claim 1, wherein the electrically non conducting material disposed within the at least one void comprises an epoxy.

5. The probe card of claim 1, wherein the electrically non conducting material disposed within the at least one void comprises a spacer.

6. The probe card of claim 5, wherein the spacer is made of the same material as the substrate.

7. A method of fabricating a probe card for testing an integrated circuit having electrical contacts, the method comprising the steps of:
   forming a substrate of an electrically non conducting material, the substrate having a first side and an opposing second side, and electrically conducting traces,
   disposing electrically conducting probes adjacent the second side of the substrate and in electrical connection with the traces,
   forming an interface member for connecting the probe card to a test station and positioning it substantially parallel to and adjacent the first side of the electrically non conducting substrate,
   forming a plurality of electrically conducting members between the first side of the electrically non conducting substrate and the interface member, the electrically conducting members being located such that one or more voids exist between the first side of the electrically non conducting member and the interface member which are not occupied by an electrically conducting member
   disposing an electrically non conducting material within one or more of the voids so as to substantially occupy the one or more voids to reinforce the substrate against flexing, bending, and warpage during testing procedures wherein the electrically conducting probes are urged against portions of an integrated circuit to be tested.

8. The method of claim 7, wherein the electrically non conducting substrate comprises a glass filed plastic.

9. The method of claim 7, wherein the electrically conducting members comprise solder bumps and the voids comprise areas not occupied by a solder bump.

10. The method of claim 7, wherein the electrically non conducting material disposed within the voids comprises an epoxy.

11. The method of claim 7, wherein the electrically non conducting material disposed within the voids comprises a spacer.

12. The method of claim 11, wherein the spacer is made of the same material as the electrically non conducting substrate.

* * * * *